United States Patent
Dick et al.

(10) Patent No.: US 6,827,218 B1
(45) Date of Patent: Dec. 7, 2004

(54) PACKAGING CONTAINER FOR ELECTRONIC COMPONENTS

(75) Inventors: Stefan O. Dick, Albuquerque, NM (US); Michelle B. Martin, Palm Springs, CA (US); Roger Nobilet, Torcy (FR); Frederic Bouvier, Revel (FR)

(73) Assignee: Sud-Chemie Inc., Louisville, KY (US)

( * ) Notice: Subject to any disclaimer, the term of this patent is extended or adjusted under 35 U.S.C. 154(b) by 0 days.

(21) Appl. No.: 09/649,903

(22) Filed: Aug. 28, 2000

(51) Int. Cl.$^7$ ................................................ B65D 85/30
(52) U.S. Cl. .................... 206/720; 206/709; 206/719
(58) Field of Search ........................ 206/709, 719, 206/722, 723, 707, 706, 701, 720, 204; 116/206, 200, DIG. 41

(56) References Cited

U.S. PATENT DOCUMENTS

| | | |
|---|---|---|
| 2,446,361 A | 8/1948 | Clibbon |
| 3,245,946 A | 4/1966 | O'connor et al. |
| 4,013,566 A | 3/1977 | Taylor |
| 4,013,799 A | 3/1977 | Smalligan et al. |
| 4,061,807 A | 12/1977 | Shaler et al. |
| 4,407,897 A | 10/1983 | Farrell et al. |
| 4,427,992 A | 1/1984 | Ritchie et al. |
| 4,568,416 A | 2/1986 | Okui et al. |
| 4,665,050 A | 5/1987 | Degen et al. |
| 4,792,484 A | 12/1988 | Moritani |
| 4,971,196 A | 11/1990 | Kitamura et al. |
| 5,078,909 A | 1/1992 | Shigeta et al. |
| 5,095,626 A | 3/1992 | Kitamura et al. |
| 5,136,827 A | 8/1992 | Sawaya |
| 5,238,648 A | 8/1993 | Kremen |
| 5,293,996 A | 3/1994 | Duncan |
| 5,295,297 A | 3/1994 | Kitamura et al. |
| 5,318,181 A | 6/1994 | Stover et al. |
| 5,401,706 A | 3/1995 | Fischer |
| 5,432,214 A | 7/1995 | Lancesseur |
| 5,496,397 A | 3/1996 | Fischer et al. |
| 5,591,379 A | 1/1997 | Shores |
| 5,702,508 A | 12/1997 | Moratalla |
| 5,857,573 A * | 1/1999 | Pakeriasamy ................ 206/454 |
| 5,875,892 A * | 3/1999 | Martin et al. ................ 116/206 |
| 5,911,937 A | 6/1999 | Hekal |
| 5,934,494 A * | 8/1999 | Takahashi et al. ........... 206/204 |
| 6,116,423 A * | 9/2000 | Troxtell et al. .............. 206/523 |

FOREIGN PATENT DOCUMENTS

| | | |
|---|---|---|
| EP | 432 438 | 2/1994 |
| WO | WO 96/33108 | 10/1996 |

* cited by examiner

*Primary Examiner*—Jila M. Mohandesi
(74) *Attorney, Agent, or Firm*—Scott R. Cox; Joan L. Simunic

(57) ABSTRACT

A packaging container for electronic components, particularly integrated circuits, which includes a tray into which the integrated circuits can be secured, a tray cover which is secured onto the tray, wherein the tray cover is composed of a plastic material, a desiccating material and an electrostatic dissipating product. The tray cover may further include a humidity indicating system incorporated into the tray cover. The packaging container may also be placed within a water and moisture-proof barrier bag for shipment purposes.

18 Claims, 6 Drawing Sheets

Figure 3: Prior art

PACKAGING CONTAINER FOR ELECTRONIC COMPONENTS

BACKGROUND OF INVENTION

1. Field of Invention

This invention relates to packaging containers for electronic components. In particular, this invention relates to a packaging container for integrated circuits, wherein the composition of the cover for that packaging container includes a desiccating material and an electrostatic charge dissipating and/or anti-static material. In addition, this invention relates to a packaging container for integrated circuits, wherein the composition of the cover for that packaging container includes a desiccating material, an electrostatic charge dissipating and/or anti-static material and a humidity indicating system.

2. Prior Art

Electronic components, such as integrated circuits ("IC"), are conventionally shipped from a factory to the user in large quantities. To protect these ICs during transportation, they are generally secured in special trays. Sections CO-027–CO-032 and CO-034, and sections CS-002–CS-008 of JEDEC publication, JEP95, contain outlines and specifications for standardized thin and thick matrix trays for various IC types.

Plastic integrated circuit devices are susceptible to moisture due to the permeable nature of their plastic components. It is well known that ICs, which have been contaminated by high levels of moisture, may not be useful. Mechanical failure of such moisture contaminated ICs often leads to the subsequent failure of the device which contains the IC due to thermal and mechanical stress. Accordingly, exposure of ICs to moisture should be limited.

For specialized types of packaging for ICs, refer to U.S. Pat. No. 4,971,196, U.S. Pat. No. 5,095,626, U.S. Pat. No. 5,293,996 and U.S. Pat. No. 5,295,297. Each of the packaging containers disclosed by these patents incorporates a moisture indicator device into the packaging container, which device is secured to the inside surface of the container. See specifically FIGS. 7 and 10 of these patents.

Specifically, U.S. Pat. No. 5,293,996 discloses a packaging container for integrated circuits containing an observation window. The container is divided into three sections, wherein one of those sections contains a compartment (11) housing a humidity indicator device (16). The humidity indicator device (16) is preferably a humidity indicator card. As best understood the card is merely placed within the compartment for viewing. The composition of the packaging material of the compartment containing the humidity indicator card is a transparent plastic which permits the moisture indicator card to be viewed from outside of the packaging container.

U.S. Pat. No. 5,318,181 discloses compartmentalized humidity sensing indicators. These humidity sensing indicators are produced on a tape reel and are secured to the inside surface of a continuous strip of humidity indicators.

U.S. Pat. No. 2,446,361 discloses a humidity indicating moisture adsorbent product secured to packaged goods. The product comprises a container (A) onto which is secured a receptacle (B). Contained within the receptacle (B) is a desiccant (C). The receptacle (B) is transparent and may be formed from plastic materials. It is screwed into a threaded mounting apparatus which is also secured to the container. It is comprised of a cylindrical wall (16), closed top (17) and a perforated bottom (18). The receptacle (B) is secured in place to the package by a collar (20) and a locking ring (22) containing threads (24, 28). The receptacle (B) may be screwed in place using one of two different designs as disclosed in FIGS. 2 and 3 of the patent.

See also U.S. Pat. No. 5,238,648 which discloses a view port in packaging through which can be viewed an oxygen indicator device.

In addition to their susceptibility to moisture, ICs can also be damaged by static electricity. Therefore, it is important that the packaging for such electronic components also be resistant to electrostatic charge. This resistance should be present in the tray on which the ICs are stored as well as in the moisture-proof bag in which the tray is shipped. A laminated packaging system for ICs, which is resistant to static charge is disclosed in U.S. Pat. No. 5,136,827 and U.S. Pat. No. 4,568,416.

It is well known that electronic components are also sensitive to particles and dust. Therefore, manufacturing and assembly of electronic devices is performed in clean rooms of class 100-10.

Current packaging products which are used to ship integrated circuits still exhibit deficiencies, including limitations caused by the composition of the packaging material. Conventionally, the packaging material used for shipping integrated circuits is opaque, thus preventing easy inspection of conventional humidity indicator cards which are contained within the packaging unless the packaging material is breached. In certain new packaging materials, the composition of the surface of the packaging is different from the composition of the remaining portion of the packaging that is adjacent to the humidity indicator so that the humidity indicator card can be viewed from outside of the packaging.

In addition, the method for attachment of the humidity indicator device to the inside surface of the packaging material is often not practical.

Further, packaging products for shipping integrated circuits often must include desiccant products because of the sensitivity of the integrated circuits to moisture. Several plastic materials which may be used for packaging have been produced which have incorporated moisture absorbing products, such as desiccating materials, into their structure. For example, U.S. Pat. No. 5,911,937 discloses a product made from 30 to 80 percent desiccant, 20 to 40 percent thermoplastic and 5 to 20 percent of a channeling agent, wherein the channeling agent includes any hydrophillic material which is miscible with a polymer-based matrix upon melt mixing to form the channeled structure. These compounds preferably include polar compounds having at least several hydroxy groups, such as polyglycols. The desiccants that can be incorporated within this plastic material include anhydrous salts, molecular sieves, silica gels, clays and starches. See also WO 96/33108.

A number of other plastic materials have been produced into which desiccating products have been incorporated. For example, U.S. Pat. No. 5,078,909 discloses a moisture absorbent product comprising 100 parts by weight of a thermoplastic resin and 5 to 400 parts of a desiccant. U.S. Pat. No. 5,432,214 discloses a plastic product containing a desiccant comprising 50–80% of a thermoplastic or thermosetting product, 20–50% of a dehydrating agent, 2–8% of an elastomer and 1–4% fibers. EP 432,438 discloses a desiccating plastic product comprising 100 parts of an absorbent particles mixed with 10 to 50 parts of a plastic particle and a reinforcing fiber. U.S. Pat. No. 4,061,807 discloses a desiccating product containing 60 to 95 parts of absorbent granules mixed with 50 to 40 parts of a thermoplastic particles. U.S. Pat. No. 5,591,379 discloses a coating or adhesive material which is placed on packaging for microelectronic devices. A desiccant product is dispersed in the binder to form the coating or adhesive. The binder may include a number of polymers.

U.S. Pat. No. 4,013,566 discloses a desiccant combined with a thermoset material. U.S. Pat. No. 4,665,050 discloses a desiccant that is embedded in a plastic without melting the plastic. U.S. Pat. No. 3,245,946 discloses a desiccant incorporated into a rubber product for absorbing the moisture contained within the rubber product. U.S. Pat. Nos. 4,792,484 and 4,407,897 disclose the use of EVOH copolymers with particular products including conventional desiccant materials. See also U.S. Pat. Nos. 5,496,397 and 5,401,706.

U.S. Pat. No. 5,702,508 discloses a moisture removing device comprising a ceramic shell with a plurality of parallel openings. The openings form elongated structure surfaces adapted to be in contact with moisture laden air moving through the openings. The surfaces have desiccant capabilities.

U.S. Pat. No. 4,665,050 discloses a self-supporting structure wherein 1 to 7 percent polymer is mixed with absorbent particles to form a sorbent product. U.S. Pat. No. 4,427,992 discloses a desiccant for semi-conductor products which may be applied in liquid form and consist of ethyl-alcohol, ethyl-acetate water and a source of boron, alumina or phosphorous and organic silane.

Finally, DE 4,013,799 discloses an insert for containers, particularly for medicines and semi-luxury consumer goods, wherein a granular drying agent is embedded in plastic.

As referenced above, integrated circuits are particularly susceptible to moisture and can also be damaged by static electricity. Further, these components are particularly sensitive to dust. Accordingly, in the prior art integrated circuits have been prepared for shipping using a complicated and expensive process which includes at least the following process steps:

a) inserting the integrated circuits into trays;

b) baking the integrated circuits dry on the trays;

c) stacking the trays on top of each other;

d) covering the tray stack with a tray cover;

e) inserting the covered tray stack in a moisture and water-proof bag;

f) inserting desiccant bags into the moisture-proof bag;

g) placing a humidity indicator card into the bag; and h) sealing the bag.

An alternative procedure included at least the following steps:

a) baking the integrated circuits dry separately from the packing trays;

b) inserting the dried integrated circuits into the trays;

c) stacking the trays on top of each other;

d) covering the tray stack with a tray cover;

e) inserting the covered tray stack in a moisture and water-proof bag;

f) inserting desiccant bags into the moisture-proof bag;

g) placing a humidity indicator card into the bag; and h) sealing the bag.

In addition to the fact that this process is complicated, labor-intensive and time-intensive, the integrated circuits are protected from moisture only after the moisture-proof bag is sealed. Integrated circuits can still absorb moisture at any time from their original baking until the sealing of the bag.

Another disadvantage of the prior art processes is that the integrated circuits are also exposed to dust for a greater period of time. This dust may even include generated dust from the desiccant bags themselves.

Accordingly, it is an object of this invention to prepare a packaging container for electronic components which reduces the level of moisture within the container during shipment.

It is still further object of the invention to disclose a packaging container for electronic components, wherein the composition includes a desiccant product.

It is still further object of the invention to disclose a packaging container for electronic components which incorporates an electrostatic charge dissipating and/or anti-static material into the composition of the packaging container.

It is still further object of the invention to disclose a packaging container for integrated circuits which produces less dust and other particulate matter during packaging and shipment.

It is still further object of the invention to utilize a process for loading electronic components that has fewer steps and reduces the time and expense of the packaging process.

These and other objects and features of the present invention will become apparent to those skilled in art from a consideration of the following detailed description, drawings and claims. The description along with the accompanying drawings provides a selected example of the construction of the device and its process of manufacturing to illustrate the invention.

SUMMARY OF THE INVENTION

In accordance with the present invention there is provided a packaging container for electronic components, which components are sensitive to humidity, which includes trays for holding the electronic components, and a tray cover, whose composition comprises a plastic material, an electrostatic charge dissipating and/or anti-static material and a desiccant for absorbing moisture contained or penetrating into the packaging container.

Alternatively, the present invention provides a packaging container for electronic components, which components are sensitive to humidity, which includes trays for holding electronic components, a tray cover, whose composition comprises a plastic material, an electrostatic charge dissipating and/or anti-static material and a desiccant for absorbing moisture contained or penetrating into the packaging container during shipment, and a humidity indicating system secured to the tray cover for determining the humidity level within the packaging container.

The present invention further includes the packaging container discussed above placed within a moisture-proof barrier bag for shipment.

The present invention further includes a process for the filling and shipping of a packaging container with integrated circuits comprising introducing integrated circuits into shipping trays;

baking the integrated circuits while in the trays to remove moisture;

securing a tray cover onto a stack of the baked trays, wherein the tray cover is comprised of a plastic material, an electrostatic charge dissipating and/or anti-static material and a desiccant for absorbing moisture contained or penetrating into the packaging container; and placing the covered tray stack containing integrated circuits within a moisture-proof barrier bag.

Alternatively, the present invention includes a process for the filling and shipping of a packaging container with the integrated circuits comprising introducing dry, baked integrated circuits into shipping trays;

securing a tray cover onto a stack of the trays, wherein the tray cover is comprised of a plastic material, an electrostatic charge dissipating and/or anti-static material and a desiccant for absorbing moisture contained or penetrating into the packaging container; and placing the covered tray stack containing integrated circuits within a moisture-proof barrier bag.

BRIEF DESCRIPTION OF THE DRAWINGS

This invention will now be described with reference to the accompanying drawings in which.

DETAILED DESCRIPTION OF THE PREFERRED EMBODIMENT

Figure 1:
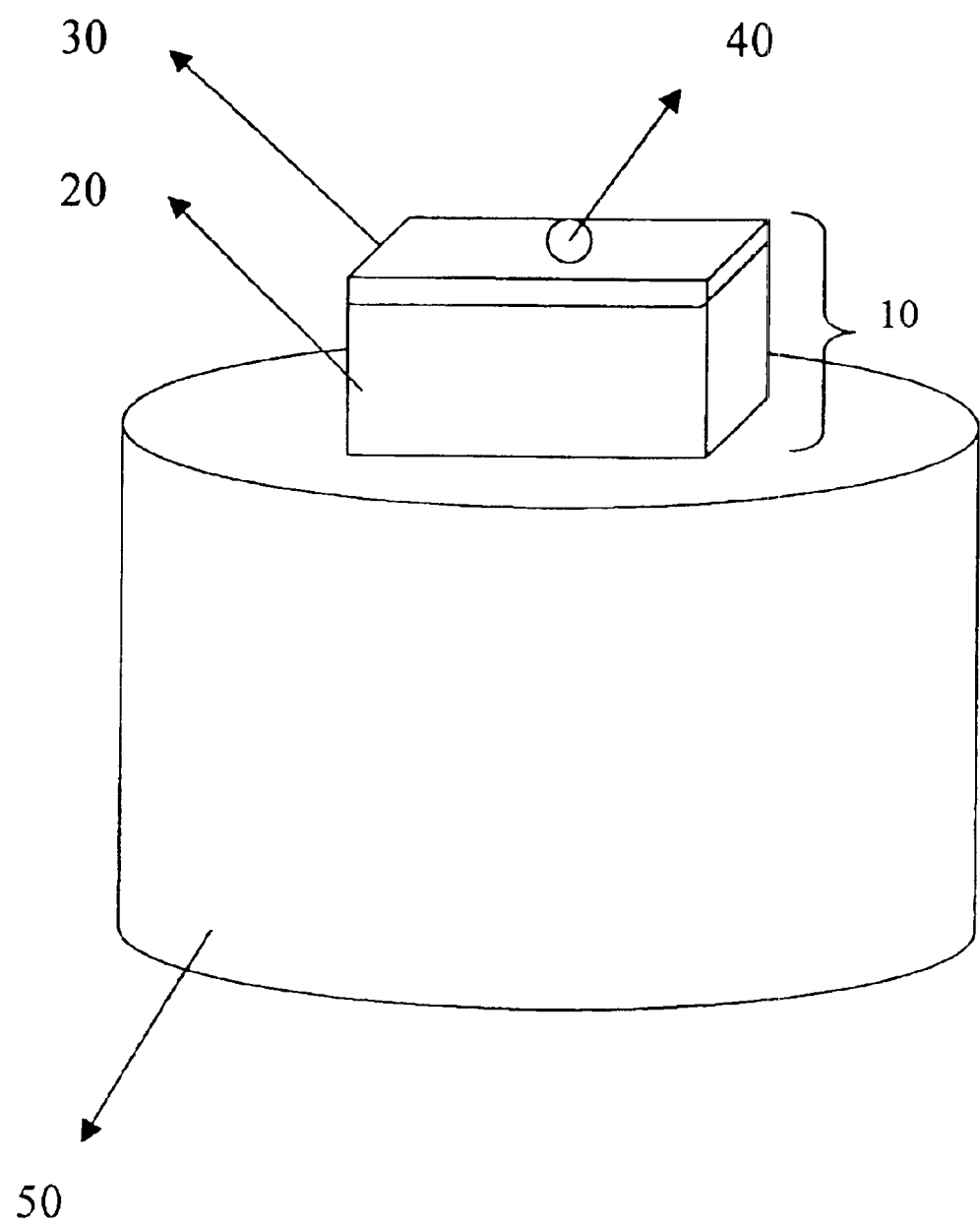
FIG. 1 is the packaging container of the present invention.

Electronic components, such as semi-conductor chips or integrated circuit chips, after manufacture and prior to utilization, are temporarily stored using a number of different storage systems. Current dry packing practices involve baking such electronic components until dry, placing them into a dry pack with desiccant bags and humidity indicator cards, sealing the bag immediately and shipping the sealed bag to the customer.

Prior art packaging containers (110) as shown in Figure were comprised of stacks of trays (120) and a tray cover (130). The packaging container (110), a humidity indicator device (140) to determine the moisture content of the air within the barrier bag (150), and desiccant bags (160) were placed in a barrier bag (150).

Figure 2:
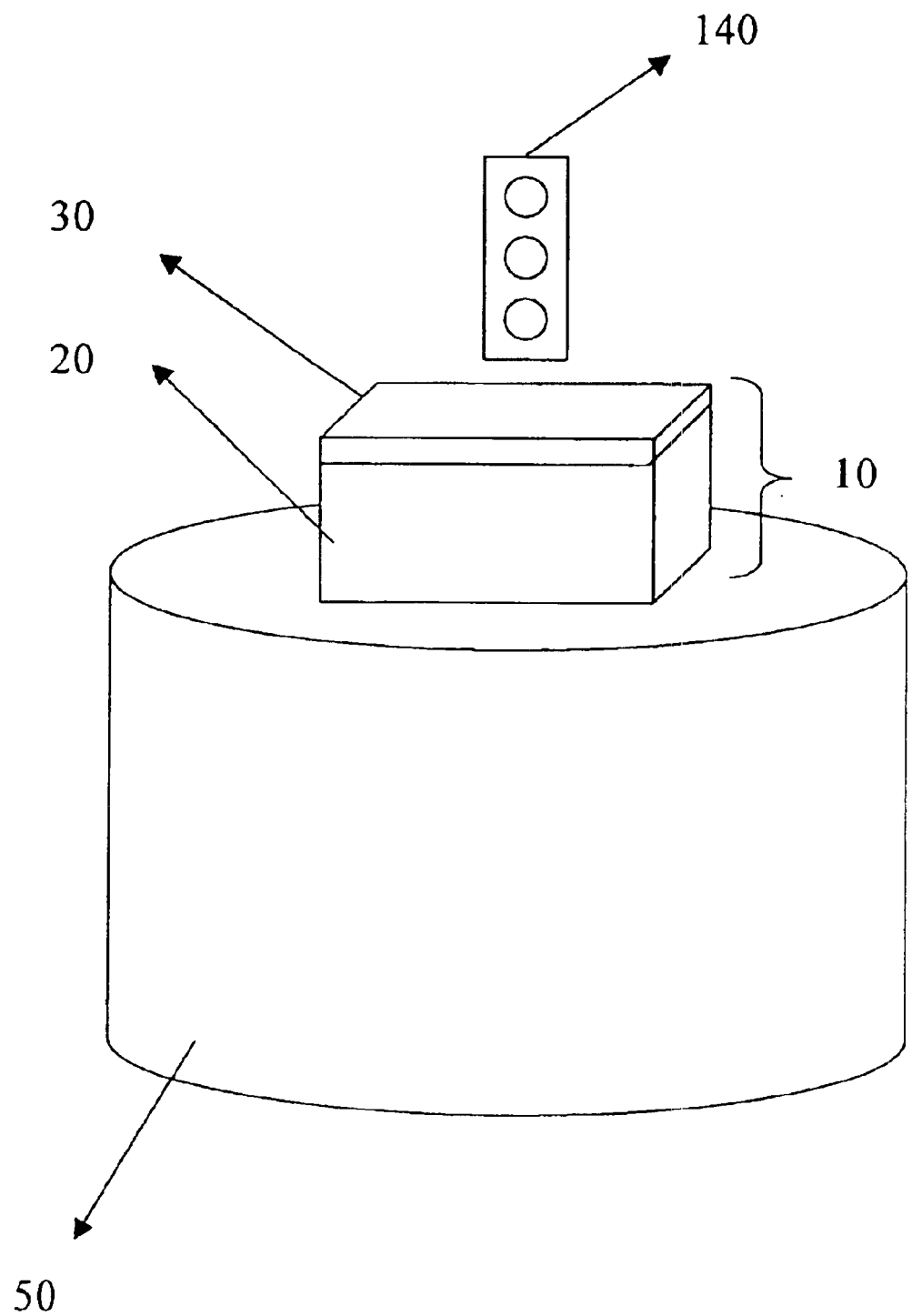
FIG. 2 is the packaging container of the present invention into which has been incorporated a humidity indicator card.
Figure 3:
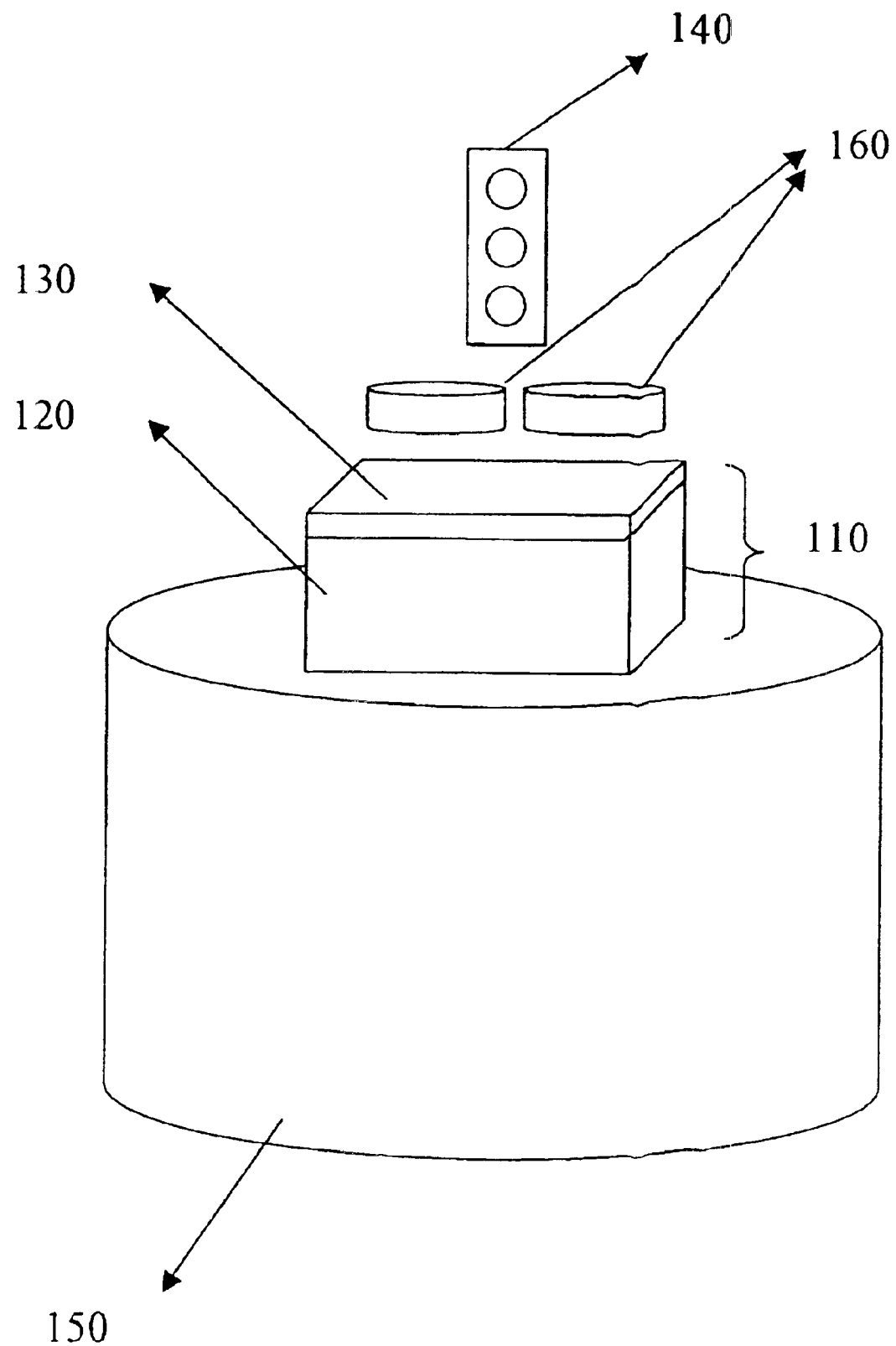
FIG. 3 is a prior art system for shipment of integrated circuits.
Figure 6:
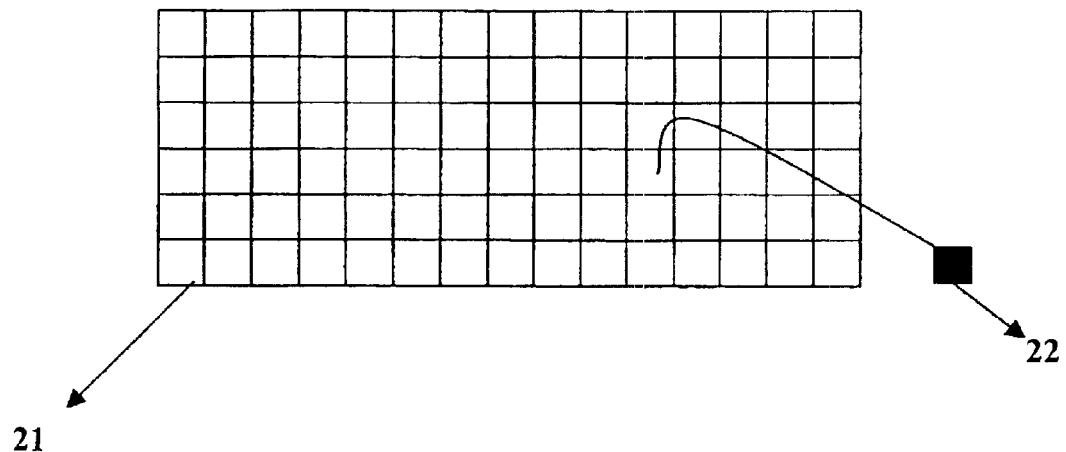
FIG. 6 is a top view of an individual tray with an integrated circuit placed thereon.

The components of the packaging container (10) of the present invention as shown in FIGS. 1 and 2 contain fewer components than the packaging container (110) of the prior art as shown in FIG. 3. Prior to packaging, the electronic components, such as integrated circuits (22), are first placed on or within an individual tray (21) as shown in FIG. 6. Any reasonable design for these trays (21) may be utilized to secure the integrated circuits during transport. However, the design of standardized trays has been established under the JEDEC tray convention, according to JEP 95.

A tray cover (30) of the invention is designed to cover the stacked trays (20). The tray cover (30) is manufactured from at least one thermoplastic or thermosetting plastic material, at least one desiccant material and preferably at least one material that contains electrostatic discharge or anti-static properties. The tray cover (30) may also contain one or more elastomers, fibers, channeling agents, processing aids, stabilizers and pigments, as desired.

Well known plastic materials may be used to form the cover (30) include polyethylene, ethylene copolymers (e.g. EVA), polypropylene, polybuten-1, polyisobutylene, polyvinylchloride, vinylchloride copolymers, polyvinylidene chloride, polystyrene, styrene copolymers, cellulose derivatives, polyamide, polycarbonate, polyoxymethylene, polyethyleneterephthalate, polybutyleneterephthalate, copolyester, polyphenylenoxides, polymethymethacrylate, acrylate copolymers, flourine containing polymers, polyphenylenesulphide, polyarylsulphones, polyaryletherketones, polyetherimids, polyimids, thermoplastic elastomdrs, polyurethanes, phenol resins, melamine resins, urea resins, epoxy resins and unsaturated polyester resins. Combinations of these plastic products may also be used to form the cover (30). In a preferred embodiment the tray cover (30) is prepared from a polypropylene material such as Moplen EPL 31 UA copolymer, produced by Montell.

A desiccant product is next incorporated into the thermoplastic and/or thermosetting plastic material. The desiccant product may be one or more selected form the groups of desiccating agents such as silica gel, a desiccant clay, activated alumina, calcium oxide, barium oxide, natural or synthetic zeolites (including molecular sieve compounds) or the like, or deliquescent salts such as magnesium sulfate, calcium chloride, aluminum chloride, lithium chloride, calcium bromide, zinc chloride, or the like. In a preferred embodiment, a molecular sieve such as NK 10 AP, produced by Ceca, is incorporated into the plastic material.

The composition for the tray cover (30) also preferably includes a material which introduces electrostatic charge dissipating and/or anti-static properties to the plastic material, and is selected from the group consisting of carbon products, anionic surfactants, cationic surfactants, amines, amides, ethoxylated fatty amines, ethoxylated fatty amides and hydrophilic graft copolymers. In a preferred embodiment, a carbon black such as Printex XE2, produced by Degussa, is incorporated into the plastic material.

Other materials may also be incorporated into the composition of the tray cover (30) including elastomers, such as Kraton G 1650, a styrene-ethylene-butadiene-styrene copolymer (SEBS), produced by Shell.

In a preferred embodiment the composition of the tray cover (30) is preferably a polypropylene plastic material comprising from about 20 to about 60 percent of the composition of the tray cover (30), preferably from about 30 to about 50 percent. Preferably the desiccant material is a molecular sieve, such as NK 10 AP produced by CECA, and comprises from about 30 to about 80 percent of the composition of the tray cover (30), preferably from about 40 to about 65 percent. The electrostatic charge dissipating material comprises from about 2 to about 10 percent of the composition of the tray cover, preferably from about 3 to about 8 percent, with the remaining components formed from other conventional additives, such as elastomers, processing aids and pigments. All percentages are by weight.

The process used for forming the tray cover includes the following steps:

a) The polypropylene and SEBS are fed into the main feeder of an extruder and heated.

b) The molecular sieve and carbon black products are fed into the extruder via a lateral feeder.

c) The mixture is degassed several times, preferably under vacuum.

d) The mixture is then pressed through a die, cooled and pelletized.

e) The pelletized material is melted, and the tray cover is injection molded using conventional procedures.

Alternatively, the tray cover (30) may be formed by thermaforming or other conventional means of forming plastic material.

The tray cover (30) may be formed in any conventional shape or structure that covers the trays (20) for the integrated circuits. Notwithstanding, it preferably complies with the standards set by JEDEC, namely JEPGS.

During the formation of the tray cover (30), an opening is preferably formed in the cover (30). This opening is designed to hold the humidity indicator device (40). The size and shape of this opening depends upon which humidity indicator device (40) is secured to the tray cover (30).

Figure 4:
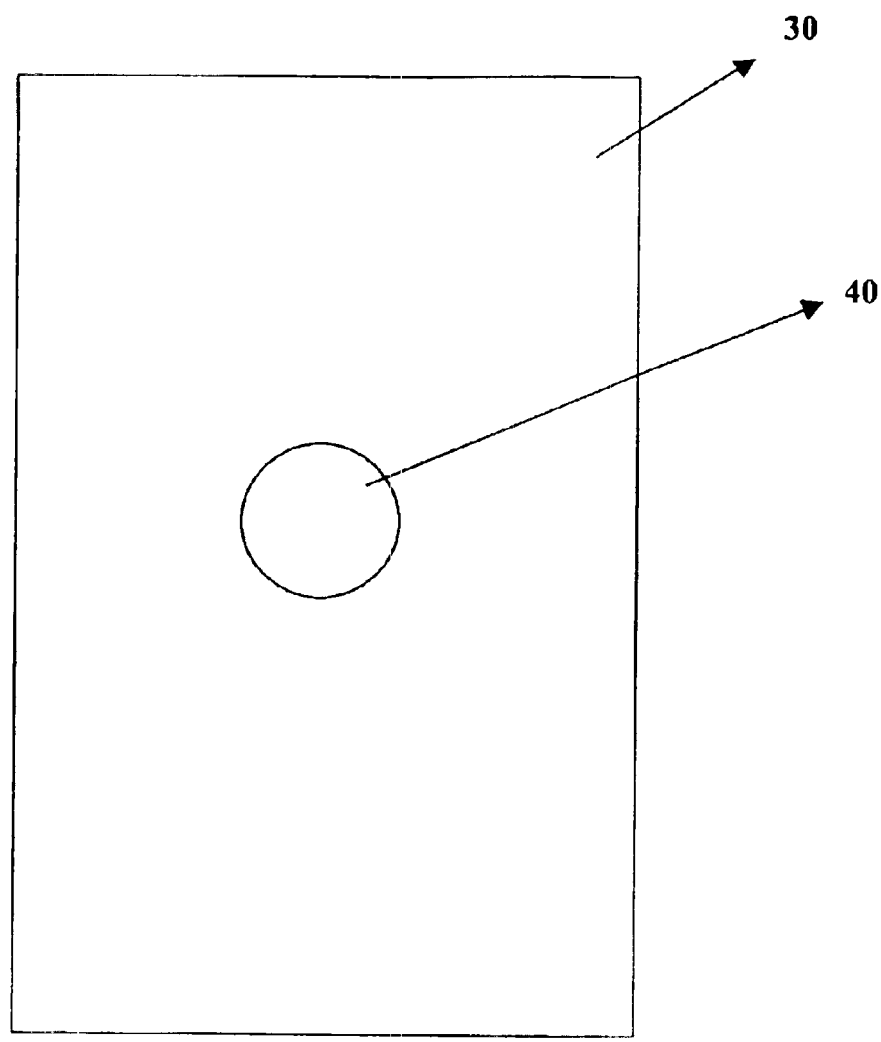
FIG. 4 is a top view of the tray cover of the packaging container of FIG. 1.
Figure 5:
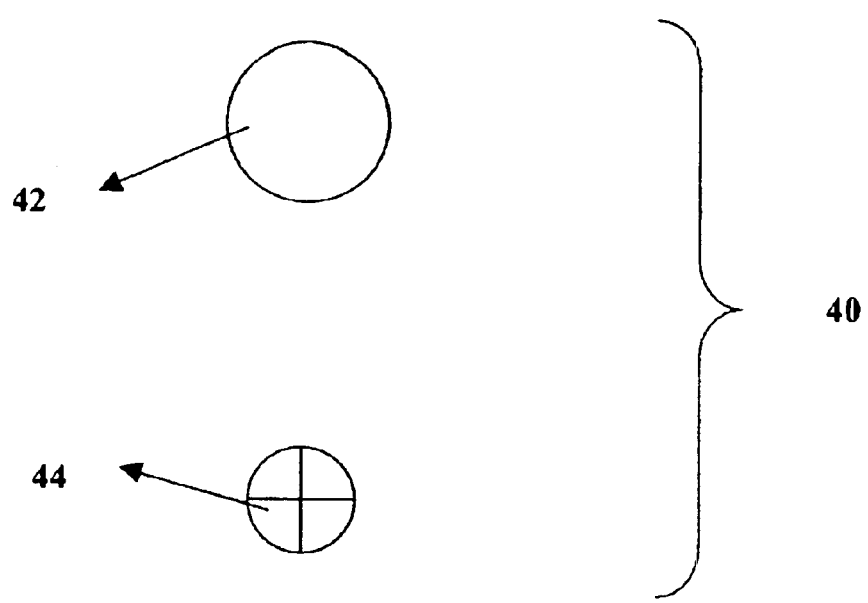
FIG. 5 is a top view of a humidity indicator disk and clear plastic disk which are mounted into the tray cover of FIG. 4.

In a preferred embodiment the opening for the humidity indicator (40) is circular. Into this circular opening is placed a clear plastic circular disk (42) as shown in FIGS. 4 and 5. This clear plastic circular disk (42) can be manufactured from any clear plastic material, preferably from copolyesters like Durastar DS2000 produced by Eastman Chemicals. This clear plastic circular disk (42) covers the opening to prevent water and water-vapor from passing into the interior of the packaging container (10).

Secured to the inside of the clear plastic circular disk (42) is the humidity indicator element (44). The humidity indicator element (44) is preferably formed from a hydrophilic blotter substrate onto which is placed a humidity indicator solution which readily discloses the level of humidity in the air surrounding the disk (42) by changing its color depending on the level of humidity present. This substrate and humidity indicator solution are well known in the industry. The substrate is preferably blotter paper, for example, manufactured by Custom Paper. Preferably, the humidity indicating solution comprises a solution of cobalt chloride. The preferred cobalt chloride solution is also well known in the industry and is hygroscopic in nature. It demonstrates different colors or different degrees of color based on the amount of moisture in the air surrounding the humidity indicator element (44). The humidity indicator solution is incorporated onto the humidity indicator substrate by conventional means.

Once the humidity indicator solution has been secured onto the substrate, the substrate is formed into the desired shape for use as the humidity indicator element (44). The humidity indicator element (44) is preferably formed into a circular shape as shown on FIGS. 4 and 5.

In order to determine the level of humidity which is indicated by the color of the humidity indicator element (44), a conventional humidity comparison element (not shown) is preferably secured next to the humidity indicator element (44). The humidity comparison element, which is preferably formed from a material which is not affected by the level of humidity present in the packaging container (10), is used to compare the level of the humidity shown on the humidity indicator element (44) against known levels of humidity shown by different colors on the humidity comparison element. The humidity comparison element of the preferred embodiment is preferably round with a circular opening cut into its middle.

The humidity indicator element (44) is preferably secured to the back of the humidity comparison element by conventional means, such as by an adhesive. By securing the humidity indicator element (44) to the humidity comparison element with a portion of the humidity indicator element (44) which is sensitive to humidity covering a circular opening in the middle of the humidity comparison element, it is easy for a viewer of this assembly to determine the relative humidity level within the container by merely comparing the color shown on the humidity indicator element (44) with the various colors referenced on the humidity comparison element. The size and shape of the humidity indicator element (44) and humidity comparison element can be altered from that shown in FIGS. 4 and 5. In addition, a single color humidity comparison element may be substituted for a multicolored humidity comparison element.

Once the electronic components to be shipped have been placed within the packaging container (10), the humidity within that container can be readily checked merely by viewing through the clear plastic disk (42) that is secured to the inside surface of the packaging container (10). Any water vapor inside the packaging container (10) will contact with the humidity indicator element (42) and produce a change in its color which then discloses the moisture content of the air within the packaging container (10). By comparing the color of the humidity indicator element (42) with the color shown on the humidity comparison element, the level of humidity within the packaging container can be readily determined.

In the preferred embodiment the packaging container (10) is placed within a water-proof barrier bag (50). The composition of the water-proof packaging bags is preferably a multi-layer composite of polymer films and aluminum foil. In one preferred embodiment the water and vapor-proof packaging material is DRI-PAK® manufactured by Richmond Technologies.

In forming the packaging container (10) of the present invention, the trays (20) are first formed from conventional material. The tray cover (30) is then formed. In a preferred embodiment the tray cover (30) is produced from a plastic material, an electrostatic charge dissipating material and/or anti-static material and a desiccating material, preferably a molecular sieve material as discussed above. An opening may then be cut into the cover (30). The humidity indicator device (40) including the humidity indicator element (44) and the circular disk (42) are then secured together by adhesive or other sealing systems. The humidity indicator device (40) is then secured through the opening to the surface of the packaging container (10) preferably on the inside surface. This humidity indicator device (40) seals the opening in the tray cover (30) completely.

Figure 7:
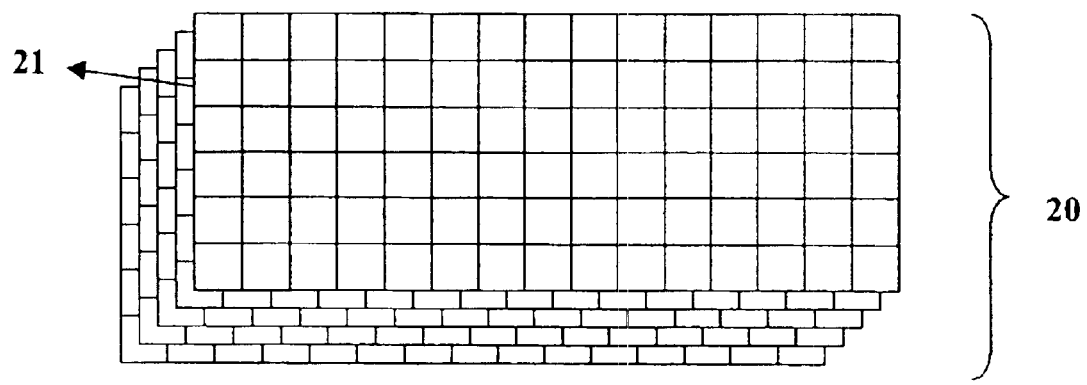
FIG. 7 is a top view of a stack of trays.

The integrated circuits are then introduced into the trays (20) as shown in FIG. 6, and the trays (20) are stacked on each other to form tray stacks (20) as shown in FIG. 7. These tray stacks (20) with the integrated circuits are then baked to dry the integrated circuits and the tray cover (30) is placed over the tray stack (30) to close the tray stack. Once the tray cover (30) is closed onto the tray stack (20) to form the packaging container (10), the packaging container (10) is then inserted into the water and moisture-proof barrier bag (50) and the bag (50) is sealed.

Alternatively, the integrated circuits may be baked dry on separate carriers and introduced already dry into the trays which are then stacked on each other to form a tray stack (20). The tray cover (30) is then placed over the tray stack (20). Once the tray cover (30) is closed onto the tray stack (20) in order to form the packaging container (10), the packaging container (10) is inserted into the water and moisture-proof barrier bag (50) and the bag (50) is sealed.

As stated above, the preferred tray cover (30) according to this invention already contains a humidity indicator device (40) as an integral part of its design. Alternatively, a tray cover (30) according to this invention without a humidity indicator device as an integral part of its design can be used. In this case a conventional humidity indicator device (140) is inserted into the water and moisture-proof bag (50) prior to sealing.

By using the tray cover (30) of the particular composition, according to the invention, several processing steps can be eliminated creating a faster process and decreasing the overhead costs. In addition, this new process reduces the time of potential exposure of the integrated circuits to moisture. Further, the problem of dust being present within the trays (20) is reduced if not eliminated as a result of the desiccant material being encapsulated within the tray cover (30). In addition, as the desiccant material is already contained in the tray cover (30), no additional weight or volume from desiccant bags has to be added to the packaging container (10).

By having a humidity indicator device (40) secured into the cover (30) of the packaging container (10), the consumer of the integrated circuits can determine merely by looking at the humidity indicator element (44) whether the level of humidity within the packaging container (10) is too high. If so, the integrated circuits may be re-baked to lower the level of the moisture present therein.

It will be apparent for the foregoing that while particular forms of the invention have been illustrated and described, various modifications can be made without departing from the spirit and scope of the invention.

What is claimed is:

1. A packaging container for integrated circuits comprising
    a tray for holding integrated circuits, and
    a tray cover, wherein the composition of the tray cover consists essentially of a plastic material, an electrostatic dissipating charge material, and a desiccating material for adsorbing moisture contained within the packaging container consisting essentially of a molecular sieve or molecular sieves.

2. The packaging container of claim 1 further comprising a humidity indicator device secured to the tray cover, which indicator device determines a humidity level within the packaging container.

3. The packaging container of claim 2 wherein the humidity indicator device is secured into an opening in the tray cover.

4. The packaging container of claim 1 wherein the plastic material of the tray cover comprises a polypropylene.

5. The packaging container of claim 2 wherein the humidity indicator device comprises a humidity indicator element and a system for securing the humidity indicator element to the tray cover.

6. The packaging container of claim 1 further comprising a water and moisture-proof barrier bag into which the tray is secured.

7. The packaging container of claim 1 wherein the composition of the tray for holding integrated circuits does not contain a desiccating material.

8. A packaging container for integrated circuits comprising
    a tray for holding integrated circuits,
    a tray cover, wherein the composition of the tray cover consists essentially of a plastic material, an electrostatic dissipating charge material, and a desiccating material for adsorbing moisture contained within the packaging container consisting essentially of a molecular sieve or molecular sieves,
    a humidity indicator device secured to the tray cover for determining the humidity level within the packaging container; and
    a moisture-proof barrier bag into which the tray and the tray cover are placed.

9. The packaging container of claim 8 wherein the humidity indicator device is secured into an opening in the tray cover.

10. The packaging container of claim 8 wherein the composition of the tray cover further comprises an antistatic material.

11. The packaging container of claim 8 wherein the humidity indicator device comprises a humidity indicator disk and a system for securing the humidity indicator disk to the tray cover.

12. The packaging container of claim 8 wherein the composition of the tray for holding integrated circuits does not contain a desiccating material.

13. A packaging container for integrated circuits comprising
    a tray for holding integrated circuits, and wherein the composition of the tray does not contain a desiccating material, and
    a tray cover, wherein the composition of the tray cover comprises a plastic material, an electrostatic dissipating charge material, and a desiccating material for adsorbing moisture contained within the packaging container, wherein the ratio of the plastic material to the desiccating material is from about 50:40 to about 30:65 and wherein the desiccating material consists essentially of a molecular sieve or molecular sieves.

14. The packaging container of claim 13 further comprising a humidity indicator device secured to the tray cover, which indicator device determines a humidity level within the packaging container.

15. The packaging container of claim 14 wherein the humidity indicator device is secured into an opening in the tray cover.

16. The packaging container of claim 13 wherein the plastic material of the tray cover comprises a polypropylene.

17. The packaging container of claim 14 wherein the humidity indicator device comprises a humidity indicator element and a system for securing the humidity indicator element to the tray cover.

18. The packaging container of claim 13 further comprising a water and moisture-proof barrier bag into which the tray is secured.

* * * * *